(12) United States Patent
Mori et al.

(10) Patent No.: US 6,184,658 B1
(45) Date of Patent: *Feb. 6, 2001

(54) BATTERY PACK PROTECTIVE CIRCUIT WITH EXTERNAL TERMINALS ON OPPOSITE SIDE OF PART MOUNTING SURFACE OF CIRCUIT BOARD

(75) Inventors: Masaki Mori; Yasuhisa Higashijima, both of Kanagawa (JP)

(73) Assignee: Mitsumi Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/274,691

(22) Filed: Mar. 24, 1999

(30) Foreign Application Priority Data

Mar. 27, 1998 (JP) ................................. 10-100023

(51) Int. Cl.[7] .................................... H01M 10/46
(52) U.S. Cl. ..................... 320/134; 320/136; 257/791

(58) Field of Search ..................... 320/107, 112, 320/134, 136; 257/787, 789, 791, 795

(56) References Cited

U.S. PATENT DOCUMENTS

| | | | | |
|---|---|---|---|---|
| 5,083,189 | * | 1/1992 | Sawaya | 257/791 |
| 5,264,656 | * | 11/1993 | Itakura et al. | 84/600 |
| 5,793,118 | * | 8/1998 | Nakajima | 257/790 |

* cited by examiner

*Primary Examiner*—Edward H. Tso
(74) *Attorney, Agent, or Firm*—McGuireWoods, LLP

(57) ABSTRACT

What is proposed is a battery pack incorporating a lithium ion battery. The battery pack has: a circuit board (10A) of the type that parts are mounted on one surface thereof, on the part-mounting surface (11A) of which a plurality of circuit parts (20) forming a protective circuit (60) for preventing the over-charge and over-discharge of the battery; and resin (30A) which seals the whole part-mounting surface of the circuit board after the circuit parts have been mounted thereon. Transistors (Q1 and Q2) and ICs (IC1 and IC2) employed as the circuit parts are bear chips.

4 Claims, 4 Drawing Sheets

BATTERY PACK PROTECTIVE CIRCUIT WITH EXTERNAL TERMINALS ON OPPOSITE SIDE OF PART MOUNTING SURFACE OF CIRCUIT BOARD

BACKGROUND OF INVENTION

1. Field of the Invention

This invention relates to a battery pack incorporating a lithium ion battery, and more particularly to a battery pack in which a circuit board protecting the battery is improved.

2. Related Art

A rechargeable battery pack used for a portable telephone set or the like is a lithium ion battery which is incorporated in an insulating package. The battery pack includes a protective circuit which prevents the over-discharge or over-charge of the battery. A plurality of circuit parts are built on a circuit board having a printed wiring pattern. A battery pack whose miniaturization is advanced, the space for the circuit board is limited. Therefore, a circuit board whose both sides are used is employed; that is, parts are built on both sides of one circuit board.

Figure 3A:
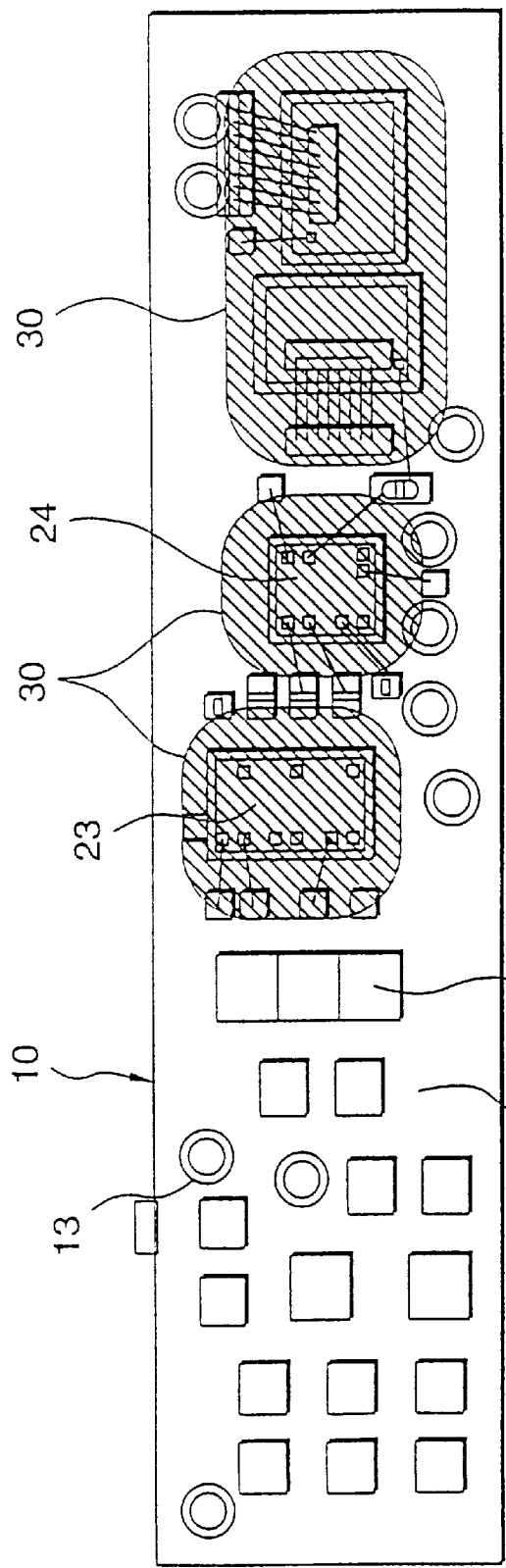
Figure 3B:
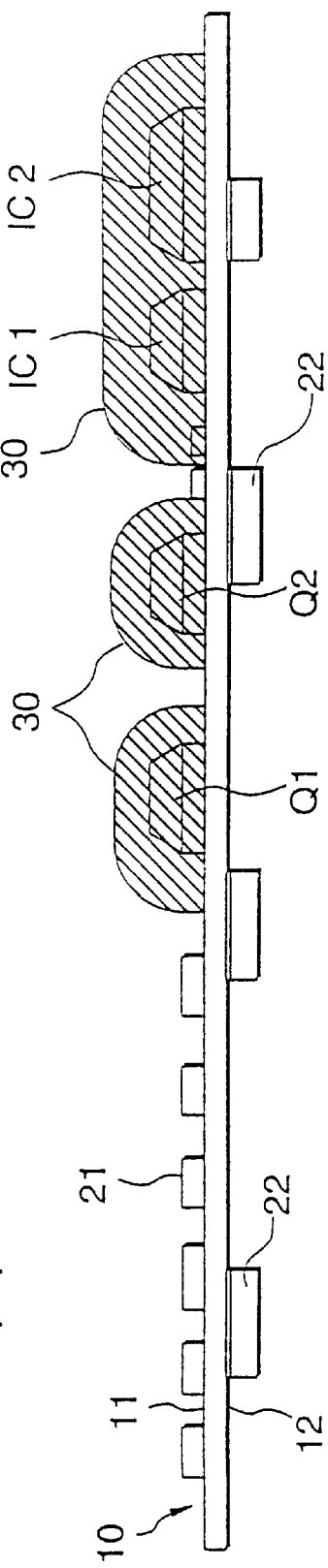

FIGS. 3(A) and 3(B) are a plan view and a side view of a conventional protective circuit COB (chip on board) type circuit board, respectively. In those figures, reference numeral 10 designates a circuit board whose both sides are used formounting parts (hereinafter referred to as "a circuit board", when applicable); 11, a first part mounting on the front surface side; 12, a second part mounting surface on the rear surface side. Reference numeral 22 designates a circuit part mounted on a second part mounting surface 12. On both part mounting surfaces, the wiring patterns are not shown. Reference numeral 13 designates through-holes which connect the two front and rear wiring patterns.

Some of the circuit parts are resin-sealed for water proof. Those parts are, in general, transistors and ICs (semiconductor integrated circuit devices). In the case FIG. 3(A), the parts 23 and 24 are to be resin-sealed; that is, those parts are covered with resin 30 after being mounted. The parts of this kind; that is, the transistors and ICs 23 and 24 are molded in their packages, and mounted on the circuit board 10 by soldering.

In the case of a battery pack used for a portable telephone set, there is a strong demand for reduction in weight. One method of reducing the weight of the protective circuit shown in FIGS. 3(A) and 3(B) is to use a bare chip of a transistor or IC. In the case of use of the bare chip, partial sealing of the parts with the resin 30 is insufficient in water proof. Especially, in the case where the circuit board 10 whose both surfaces are used for mounting parts is employed, the resin sealing (30) of one surface is low in reliability. On the other hand, in the conventional battery pack, the protective circuit board is laid out in the spaces or gaps left in the pack, so that the layout of the wires is in disorder, and it is impossible to coat the whole circuit board 10 with the resin 30. Those are the problems to be solved by the invention.

SUMMARY OF INVENTION

The foregoing object of the invention has been achieved by the provision of a battery pack incorporating a lithium ion battery, which, according to the invention, comprises:

a circuit board of the type that parts are mounted on a single surface thereof, on the part-mounting surface of which a plurality of circuit parts forming a protective circuit for preventing the over-charge and over-discharge of the battery; and resin which seals the whole part-mounting surface of the circuit board after the circuit parts have been mounted thereon, transistors and ICs employed as the circuit parts being a bare chips.

It is preferable that, in the battery pack, external connecting terminals of the protective circuit are formed on the surface opposite to the part-mounting surface of the circuit board, and the protective circuit is connected through through-holes to the external connecting terminals.

BRIEF DESCRIPTION OF THE DRAWING(S)

Figure 1A:
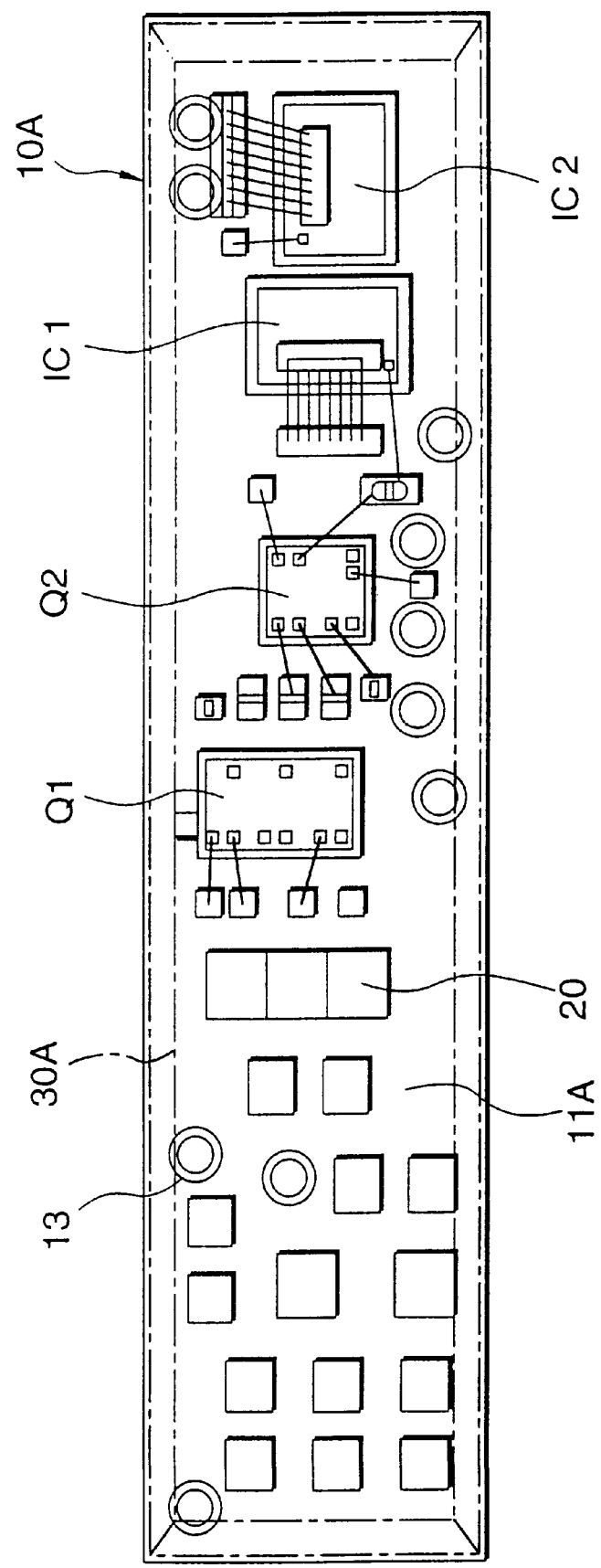
Figure 1B:
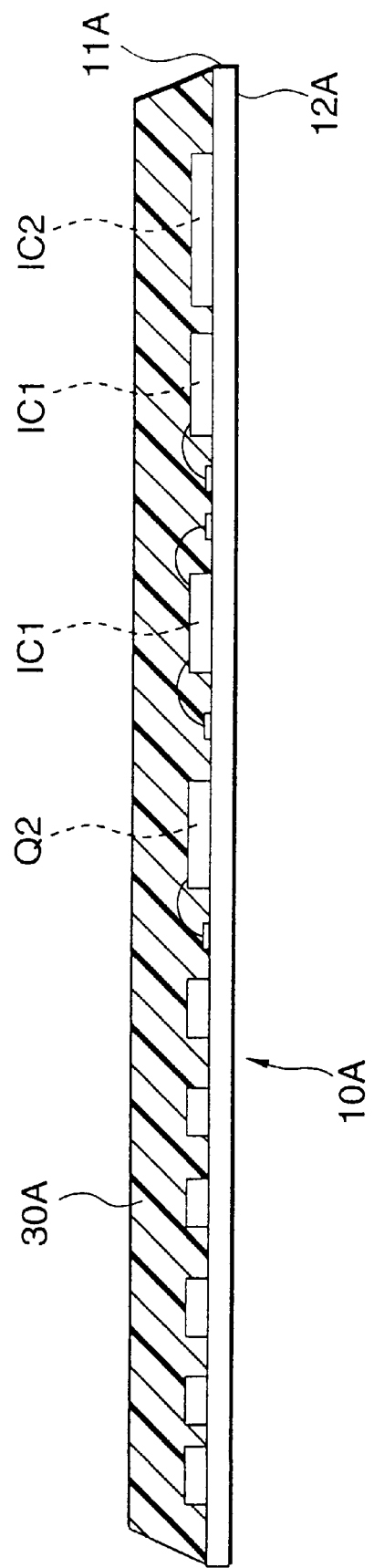

FIGS. 1(A) and 1(B) are plan and side views, respectively, showing the structure of a battery pack, which constitutes an embodiment of the invention.

Figure 2:
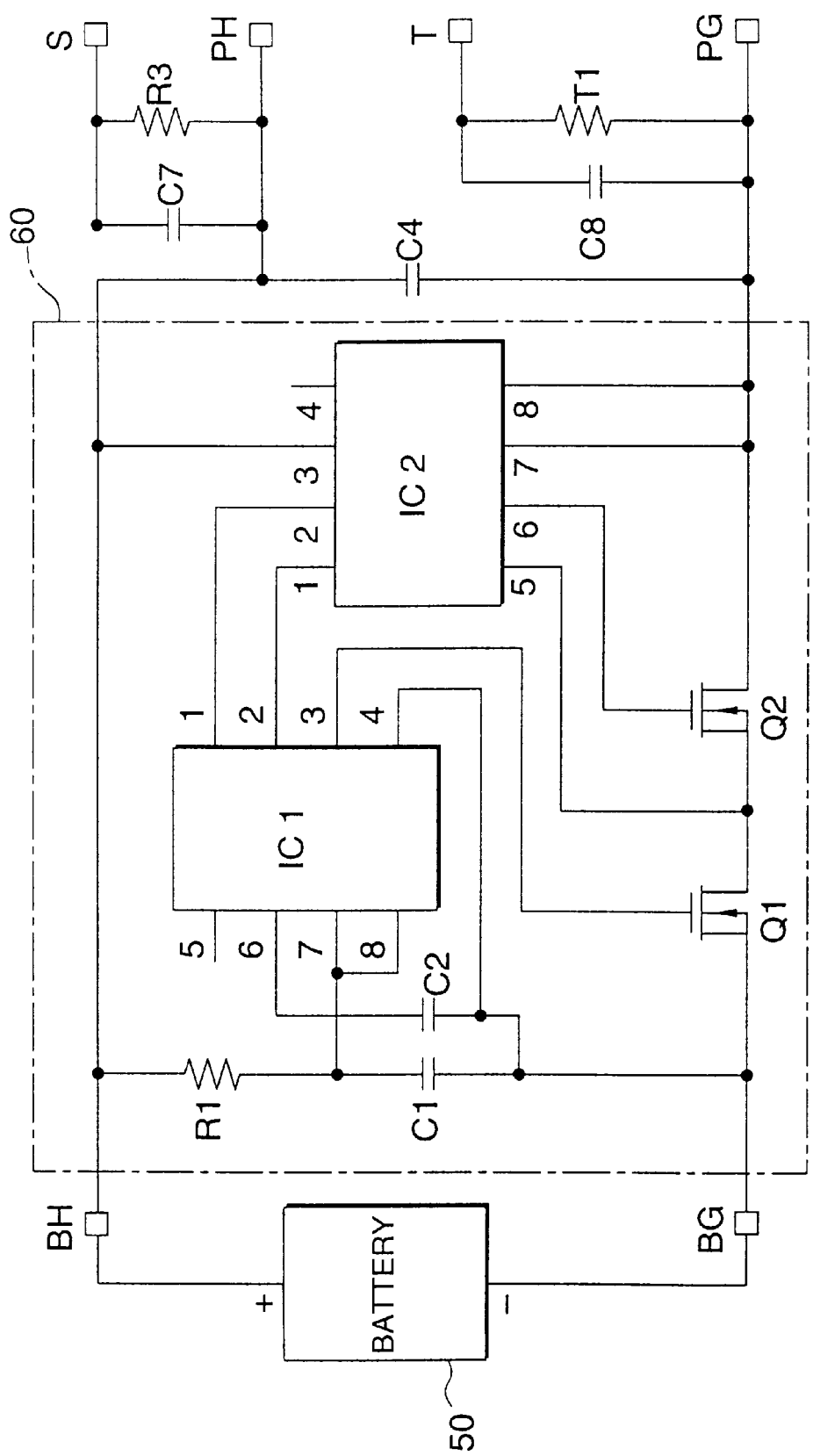

FIG. 2 is a circuit diagram of the battery pack of the invention.

FIGS. 3(A) and 3(B) are plan and side views, respectively, showing the structure of a protective circuit incorporated in a conventional battery pack.

DETAILED DESCRIPTION OF PREFERRED EMBODIMENTS

This invention will be described with reference to its preferred embodiment shown in the accompanying drawings. FIGS. 1(A) and 1(B) are a plan view and a side view of the circuit board of a protective circuit which is incorporated in a battery pack which is the embodiment of the invention. In FIG. 1, reference character 10A designates a circuit board whose single side is used for mounting parts (hereinafter referred to as "a circuit board 10A", when applicable). More specifically, the circuit board 10A has a part mounting surface 11A on which a plurality of circuit parts 20 are mounted which form a protective circuit for prevention of the over-discharge or over-charge of a lithium ion battery. Reference character 30A designates resin which seals the whole part mounting surface 11A of the circuit board 10A after the circuit parts 20 have been mounted thereon. Transistors Q1 and Q2, and integrated circuits IC1 and IC2 which are used as the circuit parts 20 are bare chips.

The external connecting terminals of the aforementioned protective circuit are formed on the surface 12A which is opposite to the part mounting surface, and the protective circuit is connected through through-holes 13 to the external connecting terminals.

FIG. 2 is a circuit diagram showing the internal circuit of the battery pack according to the invention. In FIG. 2, reference numeral 50 designates the lithium ion battery; and 60, the protective circuit. The battery 50 is connected to the terminals BH and BG of the protective circuit 60. The integrated circuit IC1 is paired with the transistor (FET) Q1, to prevent the over-discharge of the battery 50. The integrated circuit IC2 is paired with the transistor (FET) Q2, to prevent the over-charge of the battery 50. Reference characters PH and PG designate charge and discharge terminals, respectively.

In the invention, the wiring in the protective circuit 60 is so designed that the parts are arranged crowded by art work, and this part is coated, as a whole, with the resin 30A. This feature eliminates the difficulty that, for instance when the battery pack is put in water, the protective function does not work. The parts Q1, Q2, IC1 and IC2 are bare chips. This feature reduces the weight of the battery pack as much. In addition, in the circuit 60, no through-hole is provided on one surface, so that its coating can be achieved with ease. of course, it is applicable for coating at least a part of protective circuit portion on the circuit board.

As was described above, according to the invention, it is made possible to mount the bare chips on the circuit board adapted to protect the lithium ion battery. Hence, the battery pack of the invention, when compared with the conventional one, is reduced in weight without impairing the water proof characteristic.

What is claimed is:

1. A battery pack incorporating a lithium ion battery comprising:

a circuit board incorporated within a mobile communication device said circuit board having parts mounted on only a single surface thereof, said part-mounting surface including a plurality of circuit parts including bare chips forming a protective circuit for preventing over-charge and over-discharge of said battery;

resin sealing the whole part-mounting surface of said circuit board including all of said circuit parts forming the protective circuit; and external connecting terminals of said protective circuit formed on a surface opposite to said part-mounting surface of said circuit board, wherein said protective circuit is connected through through-holes to said external connecting terminals.

2. A battery pack as claimed in claim 1, wherein said circuit parts include transistors including, bare chips.

3. A battery pack as claimed in claim 1, wherein said circuit parts includes integrated circuits being bare chips.

4. A battery pack incorporating a lithium ion battery comprising:

a circuit board incorporated within a mobile communication device said circuit board having parts mounted on only a single surface thereof, said part-mounting surface including a plurality of circuit parts forming a protective circuit for preventing over-charge and over-discharge of said battery;

resin sealing at least said protective circuit of said part-mounting surface of said circuit board after said circuit parts have been mounted thereon; and external connecting terminals of said protective circuit formed on a surface opposite to said part-mounting surface of said circuit board, and connected through through-holes to said protective circuit, wherein said circuit parts including transistors and integrated circuits are bare chips.

* * * * *